United States Patent
Chen et al.

(10) Patent No.: US 11,281,044 B2
(45) Date of Patent: Mar. 22, 2022

(54) COLOR FILTER SHEET, PRODUCTION METHOD THEREOF, AND DISPLAY APPARATUS

(71) Applicant: BOE Technology Group Co., Ltd., Beijing (CN)

(72) Inventors: Yu Ju Chen, Beijing (CN); Gang Yu, Beijing (CN); Jing Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/485,055

(22) PCT Filed: Jan. 31, 2019

(86) PCT No.: PCT/CN2019/074171
§ 371 (c)(1),
(2) Date: Aug. 9, 2019

(87) PCT Pub. No.: WO2019/154264
PCT Pub. Date: Aug. 15, 2019

(65) Prior Publication Data
US 2020/0257163 A1    Aug. 13, 2020

(30) Foreign Application Priority Data
Feb. 7, 2018 (CN) .......................... 201810125358.5

(51) Int. Cl.
*G02F 1/1335* (2006.01)
*H01L 27/32* (2006.01)
(Continued)

(52) U.S. Cl.
CPC ...... *G02F 1/133514* (2013.01); *H01L 27/322* (2013.01); *H01L 27/3246* (2013.01);
(Continued)

(58) Field of Classification Search
CPC .................................................. G02F 1/133514
See application file for complete search history.

(56) References Cited

U.S. PATENT DOCUMENTS

| 10,067,386 B2 | 9/2018 | Kuksenkov |
| 2010/0208328 A1 | 8/2010 | Heikenfeld et al. |

(Continued)

FOREIGN PATENT DOCUMENTS

| CN | 104728779 A | 6/2015 |
| CN | 106707610 A | 5/2017 |

(Continued)

OTHER PUBLICATIONS

Second Office Action, including Search Report, for Chinese Patent Application No. 201810125358.5, dated Nov. 1, 2019, 20 pages.

*Primary Examiner* — Edmond C Lau
(74) *Attorney, Agent, or Firm* — Westman, Champlin & Koehler, P.A.

(57) ABSTRACT

There is provided a color filter sheet, a production method of a color filter sheet, and a display apparatus. A first quantum dot light-emitting portion, in which a light incident surface or a light emergent surface is a convex surface, is present on a base substrate of the color filter sheet, wherein the first quantum dot light-emitting portion is configured to emit light having a second wavelength after excitation with light having a first wavelength from the light incident surface.

11 Claims, 4 Drawing Sheets

(51) Int. Cl.
*H01L 51/00* (2006.01)
*H01L 51/50* (2006.01)
*H01L 51/52* (2006.01)

(52) U.S. Cl.
CPC ........ *H01L 51/0005* (2013.01); *H01L 51/502* (2013.01); *H01L 51/5265* (2013.01)

(56) References Cited

U.S. PATENT DOCUMENTS

| | | | |
|---|---|---|---|
| 2011/0176328 A1* | 7/2011 | Anandan | G02F 1/133606 362/606 |
| 2017/0299923 A1 | 10/2017 | Kuksenkov | |
| 2018/0284534 A1 | 10/2018 | Song et al. | |
| 2019/0196259 A1* | 6/2019 | Lee | G02F 1/133514 |

FOREIGN PATENT DOCUMENTS

| CN | 107004741 A | 8/2017 |
|---|---|---|
| CN | 107357080 A | 11/2017 |
| CN | 108169957 A | 6/2018 |

* cited by examiner

COLOR FILTER SHEET, PRODUCTION METHOD THEREOF, AND DISPLAY APPARATUS

CROSS-REFERENCE TO RELATED APPLICATION

This application is a Section 371 National Phase application of International Application No. PCT/CN2019/074171, filed on 31 Jan. 2019. which has not yet published, and claims priority to Chinese Patent Application No. 201810125358.5 filed on Feb. 7, 2018, the contents of which are incorporated herein in their entireties by reference.

TECHNICAL FIELD

This disclosure relates to the field of display. Particularly, this disclosure relates to a color filter sheet, a production method of a color filter sheet, and a display apparatus.

BACKGROUND ART

With the continuous development of the display technology, the requirements for the image quality of display apparatuses are higher and higher. With respect to a typical display apparatus, full-color display is achieved by a color filter. For example, a liquid crystal display apparatus may comprise a backlight module, an array substrate, a color filter substrate (color filter sheet), and a liquid crystal layer located between the array substrate and the color filter substrate. White light emitted from the backlight module passes through a color filter layer on the color filter substrate to display various colors.

SUMMARY OF THE INVENTION

In one aspect of this disclosure, there is provided a color filter sheet, comprising:

a base substrate;

a first quantum dot light-emitting portion located on the base substrate, wherein the first quantum dot light-emitting portion has a light incident surface facing the base substrate and a light emergent surface departing from the base substrate, the first quantum dot light-emitting portion is configured to emit light having a second wavelength after excitation with light having a first wavelength from the light incident surface, wherein one of the light incident surface and the light emergent surface of the first quantum dot light-emitting portion is a convex surface.

In some Examples, the color filter sheet further comprises:

a second quantum dot light-emitting portion located on the base substrate, wherein the second quantum dot light-emitting portion has a light incident surface facing the base substrate and a light emergent surface departing from the base substrate, the second quantum dot light-emitting portion is configured to emit light having a third wavelength after excitation with light having a first wavelength from the light incident surface, wherein the third wavelength is different from the second wavelength.

In some Examples, the light incident surface of the first quantum dot light-emitting portion is a convex surface, and the light incident surface of the second quantum dot light-emitting portion is a convex surface.

In some Examples, the light emergent surface of the first quantum dot light-emitting portion is a convex surface, and the light emergent surface of the second quantum dot light-emitting portion is a convex surface.

In some Examples, the color filter sheet further comprises: a transparent portion for transmitting light having a first wavelength located on the base substrate.

In some Examples, the light having the first wavelength is blue light, and one of the light having the second wavelength and the light having the third wavelength is red light and the other one is green light.

In some Examples, a pixel defining layer is present on the base substrate, the first quantum dot light-emitting portion is located in a first opening of the pixel defining layer, and the convex surface of the first quantum dot light-emitting portion has a radius of curvature in a range of 1 to 5 times the length of the first opening.

In some Examples, the second quantum dot light-emitting portion is located in a second opening of the pixel defining layer, and the convex surface of the second quantum dot light-emitting portion has a radius of curvature in a range of 1 to 5 times the length of the second opening.

In some Examples, the color filter sheet further comprises a Bragg reflection layer, wherein the Bragg reflection layer is located between the base substrate and the first quantum dot light-emitting portion, and is configured to at least transmit a part of light having a first wavelength emitted from a light source; and/or configured to at least partially reflect light having a second wavelength emitted from the first quantum dot light-emitting portion toward the Bragg reflection layer.

In some Examples, the color filter sheet further comprises a Bragg reflection layer, wherein the Bragg reflection layer is located between the base substrate and the second quantum dot light-emitting portion, and is configured to at least transmit a part of light having a first wavelength emitted from a light source; and/or configured to at least partially reflect light having a third wavelength emitted from the second quantum dot light-emitting portion toward the Bragg reflection layer.

In another aspect of this disclosure, there is provided a display apparatus, comprising a light source and the color filter sheet of any one of the Examples described above. The light source has a light emergent side facing the base substrate of the color filter sheet, and the light source is configured to emit light having the first wavelength.

In still another aspect of this disclosure, there is provided a production method of a color filter sheet, comprising:

providing a first quantum dot ink comprising a first quantum dot and a first resin, wherein the first quantum dot is configured to emit light having a second wavelength after excitation with light having a first wavelength;

providing a base substrate and forming a pixel defining layer on the base substrate;

inkjet-printing the first quantum dot ink onto a first opening of the pixel defining layer to form a first quantum dot ink layer having a printed surface; and drying the first quantum dot ink layer with the printed surface facing down to form a first quantum dot light-emitting portion in which the printed surface is a convex surface.

In some Examples, the method further comprises:

providing a second quantum dot ink comprising a second quantum dot and a second resin, wherein the second quantum dot is configured to emit light having a third wavelength after excitation with light having a first wavelength, wherein the third wavelength is different from the second wavelength; and inkjet-printing the second quantum dot ink onto a second opening of the pixel defining layer to form a second quantum dot ink layer having a printed surface; and drying the second quantum dot ink layer with the printed surface of the second quantum dot ink facing down to form a second quantum dot light-emitting portion in which the printed surface is a convex surface.

In some Examples, the method further comprises:

forming a transparent portion for transmitting light having a first wavelength in a third opening of the pixel defining layer.

In some Examples, a step of spin drying is used in the drying, and the spin drying has a spin speed of 10 rpm to 1000 rpm, a drying temperature of 20° C. to 160° C., and a drying time of 1 minute to 60 minutes.

In some Examples, the convex surface of the first quantum dot light-emitting portion has a radius of curvature in a range of 1 to 5 times the length of the first opening.

In some Examples, the convex surface of the second quantum dot light-emitting portion has a radius of curvature in a range of 1 to 5 times the length of the second opening.

In some Examples, the first quantum dot ink has a viscosity of 5-20 cPs and a surface tension of 20-40 dynes.

In some Examples, the second light-emitting quantum dot ink has a viscosity of 5-20 cPs and a surface tension of 20-40 dynes.

DESCRIPTION OF DRAWINGS

In order to illustrate the technical solutions in Examples of this disclosure more clearly, figures required for describing the Examples will be simply introduced below. It is apparent that the figures described below are merely exemplary Examples of this disclosure, and other figures may be further obtained by those of ordinary skill in the art according to these figures without exerting inventive work.

DESCRIPTION OF EMBODIMENTS

The technical solutions in the Examples of this disclosure will be described clearly and fully below in conjunction with specific embodiments of this disclosure. Obviously, the embodiments and/or Examples described are merely a part of the embodiments and/or Examples of this disclosure, rather than all of the embodiments and/or Examples. Based on the embodiments and/or Examples of this disclosure, all other embodiments and/or Examples obtained by those of ordinary skill in the art without performing inventive work belong to the scope protected by this disclosure.

In this disclosure, the layer and the film may be interchangeably used, unless specifically indicated. In this disclosure, all characteristics of numeric values mean to be within an error range of measurement, for example within ±10%, within ±5%, or within ±1% of a defined numeric value. Terms "first", "second", "third", and the like are for the purpose of description only, and cannot be understood as indicating or suggesting relative importance or implying the number of technical features indicated. Thereby, a characteristic defined by "first", "second", "third", and the like may expressly or impliedly comprises one or more characteristics.

In this disclosure, a quantum dot refers to a semiconductor crystal composed of a collection of a large number of atoms, for example a semiconductor crystal of elements of group II-VI or III-V. The size of these atoms may be, for example several nanometers to tens of nanometers. A quantum dot will lead to quantum confinement effect (electrons exhibit an intermittent energy state in atoms of the quantum dot) due to the dimension of its particle diameter, so that a quantum dot particle can generate light having a corresponding wavelength range and form photoluminescence when the quantum dot particle is irradiated with a light beam.

Exemplarily, the quantum dot may be a core-shell structure, and the core and the shell are each formed from a semiconductor material. For example, the material of the core and the shell is at least one of CdSe, ZnS, CdS, ZnTe, CdSe, CdS, CdTe, ZnO, ZnSe, ZnS, ZnTe, HgSe, HgTe, CdZnTe, InP, InN, GaN, InSb, InAsP, InGaAs, GaAs, GaP, GaSb, AlP, AlAs, AlSb, CdSeTe, ZnCdSe, PbSe, PbTe, PbS, CsPbI3, and PbSnTe. The material of the shell has a higher band gap than that of the material of the core, or the material of the core is formed by combining various compounds and the material of the shell is the material having the highest band gap among the materials of the core.

For example, the light-emitting wavelength or waveband of the quantum dot may be controlled by controlling the particle diameter of the quantum dot. Taking a ZnS quantum dot as an example, the quantum dot may emit red light when the size of the quantum dot is mainly 9-10 nm, and the quantum dot may emit green light when the size of the quantum dot is mainly 7 nm.

An Example of this disclosure provides a color filter sheet, which may improve the absorbance of excitation light and/or further improve the light extraction efficiency.

In one aspect of this disclosure, there may be provided a color filter sheet, comprising:

a base substrate;

a first quantum dot light-emitting portion located on the base substrate, the first quantum dot light-emitting portion has a light incident surface and a light emergent surface, the first quantum dot light-emitting portion is configured to emit light having a second wavelength after excitation with light having a first wavelength from the light incident surface, wherein the light incident surface of the first quantum dot light-emitting portion is a convex surface, or the light emergent surface of the first quantum dot light-emitting portion is a convex surface.

The color filter sheet may further comprise:

a second quantum dot light-emitting portion located on the base substrate, the second quantum dot light-emitting portion has a light incident surface and a light emergent surface, the second quantum dot light-emitting portion is configured to emit light having a third wavelength after excitation with light having a first wavelength from the light incident surface, wherein the third wavelength is different from the second wavelength.

Exemplarily, when the light incident surface of the first quantum dot light-emitting portion is a convex surface, the light incident surface of the second quantum dot light-emitting portion is a convex surface.

Exemplarily, when the light emergent surface of the first quantum dot light-emitting portion is a convex surface, the light emergent surface of the second quantum dot light-emitting portion is a convex surface.

The color filter sheet may further comprise:

a third transparent portion for transmitting light having a first wavelength located on the base substrate.

In some Examples of this disclosure, the first quantum dot light-emitting portion and the second quantum dot light-emitting portion may each comprise at least one quantum dot and at least one scattering particle dispersed in a medium, for example resin, glass, and the like. For example, by exemplifying the first quantum dot light-emitting portion and the second quantum dot light-emitting portion corresponding to red light and green light, respectively, the first quantum dot light-emitting portion comprises a plurality of red quantum dot particles and scattering particles; and similarly, the second quantum dot element comprises green quantum dot particles and scattering particles. The scattering particle enables a light beam passed into the quantum dot light-emitting portion to achieve waveguide propagation and to be randomly and uniformly diffused, and quantum dots are sufficiently excited to form photoluminescence.

In some Examples of this disclosure, the third transparent portion comprises at least one scattering particle, for example a plurality of scattering particles dispersed in a medium, for example resin, glass, and the like. The scattering particle enables all of a part of light having a first wavelength emitted from a light source to achieve waveguide propagation and is emitted after random and uniform diffusion.

In some Examples of this disclosure, the resin may include at least one of epoxy resin, polyurethane resin, polymethyl methacrylate resin, and the like, and the glass may include at least one of silicon glass, boron glass, phosphate glass, and the like.

In some Examples of this disclosure, the scattering particle may include at least one of zinc oxide, titanium dioxide, silicon dioxide, and the like.

In the description below, description is made by taking an example in which the light having a first wavelength is blue light, the light having a second wavelength is red light, and the light having a third wavelength is green light. However, this disclosure is not limited thereto. For example, the light having a first wavelength may have a wavelength range in a range of less than 460 nm. Furthermore, the light having a second wavelength may also be green light, and the light having a third wavelength is red light. Additionally, the light having a first wavelength may be provided by a light source. Of course, the light having a first wavelength may also be another light, for example violet light, ultraviolet, and the like; and/or the light having a second wavelength or a third wavelength may also be yellow light, and the like. This disclosure includes these cases but is not limited thereto.

Therefore, the first quantum dot light-emitting portion may be a quantum dot light-emitting portion emitting red light, the second quantum dot light-emitting portion may be a quantum dot light-emitting portion emitting green light, and the third transparent portion is a transparent portion for transmitting blue light. In the description below, the first quantum dot light-emitting portion and/or the second quantum dot light-emitting portion may be each sometimes referred to as a quantum dot light-emitting portion. the first quantum dot light-emitting portion, the second quantum dot light-emitting portion, and the transparent portion may be provided on in the same plane.

In the description below, description is made by taking an example in which the light incident surfaces or the light emergent surfaces of both the first quantum dot light-emitting portion and the second quantum dot light-emitting portion are convex surfaces. However, this disclosure is not limited thereto, as long as the light incident surface or the light emergent surface of at least one of the first quantum dot light-emitting portion and the second quantum dot light-emitting portion is a convex surface.

In the description below, a quantum dot light-emitting portion emitting red light may be sometimes referred to as a red quantum dot light-emitting portion. A quantum dot light-emitting portion emitting green light may be sometimes referred to as a green quantum dot light-emitting portion.

In a quantum dot color filter film, quantum dots may be added to a negative photoresist instead of dyes, due to characteristics such as photoluminescence, narrow full width at half maximum, and the like of the quantum dots. Furthermore, the quantum dot color filter film may be formed by a photolithographic process or may be formed by an inkjet printing process with a quantum dot ink. The solvent system of the quantum dot ink is typically propylene glycol methyl ether acetate (PGMEA). PGMEA is an organic solvent having a very strong polarity, whereas the ligand of a typical quantum dot material is often a non-polar ligand such as oleic acid, and the like. Therefore, in this quantum dot ink, the ligand of the quantum dot is desired to be changed to a polar ligand. However, a typical polar ligand has a relatively short chain length, and there are problems such as agglomeration of quantum dots, low doping concentration of quantum dots, and the like. Additionally, quantum dots may also react with additives in the quantum dot ink. When the concentration of quantum dots is relatively high, agglomeration and quenching of quantum dots will easily occur. Therefore, the concentration of quantum dots in the quantum dot ink will not be excessively high. When the concentration of quantum dots is relatively low, leakage of a small amount of excitation light will easily occur and the color purity is thus influenced.

Figure 1:
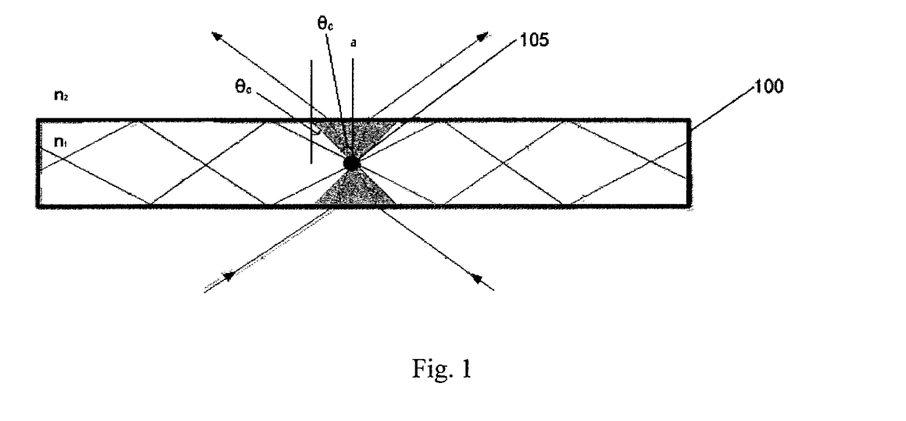
FIG. 1 is a schematic diagram exemplarily illustrating a light extraction behavior of a quantum dot thin film.

FIG. 1 is a schematic diagram exemplarily illustrating a light extraction behavior of quantum dots in a quantum dot thin film 100 in which a light incident surface or an emergent surface is planar. In this schematic diagram, it illustrates that both the light emergent surface and the light incident surface are planar at the same time.

As shown in FIG. 1, The quantum dot thin film 100 in which the light incident surface and the emergent surface are parallel comprises a quantum dot 105. In this figure, the lower surface is the light incident surface, and the upper surface is the light emergent surface. The quantum dot 105 is configured to emit red light or green light after excitation with blue light. Therefore, only the light deviating the axis a perpendicular to the surface of the thin film at an angle within $\theta_c$ (i.e., the grey angle region) may be emitted from the upper surface, and the light deviating the axis perpendicular to the surface of the thin film at an angle outside $\theta_c$ is subjected to total reflection in the quantum dot thin film 100, wherein $$\theta_c = \arcsin(n_2/n_1)$$

wherein $n_2$ represents the refractive index of the environment. When the environment is air, $n_2$ is approximately 1. $n_1$ represents the refractive index of the quantum dot thin film 100 and the value thereof may be 1.4-1.5. Therefore, the angle $\theta_c$ may be in a range of 41.8-45.5 degrees according to the material of the quantum dot thin film 100.

Furthermore, at the lower surface, i.e., the light incident surface, only the light radiated on the grey region can reach the quantum dot 105. The light radiated on the lower surface on both sides of the grey region cannot reach the quantum dot 105.

In other words, in a quantum dot light-emitting portion 100 in which a light incident surface or a light emergent surface is planar, a part of light emitted from the quantum dot 105 cannot be emitted from the light emergent surface but is confined in the quantum dot thin film by total reflection; similarly, the quantum dot 105 cannot receive incident light from the entire light incident surface but can only receive incident light radiated on a part of the light incident surface.

The light-emitting behavior of the quantum dot color filter film is light emission by light excitation. point light source emission is formed after the quantum dot 105 is excited with blue light. However, if this quantum dot color filter film forms a planar thin film layer, point light emission will lead to great reduction of the light emission efficiency of the quantum dot light-emitting portion due to the phenomenon of incomplete emergence and incomplete received incidence caused by the refractive index difference. With respect to a color filter sheet, the ability of color conversion thereof is influenced by the phenomenon described above besides the absorbance. As a light emergent layer, a typical thin film has a flat light emergent surface, therefore total reflection may be formed when light is emitted due to the influence of the refractive index difference at the interface even if the film thickness is increased, which leads to a low light extraction efficiency. According to this disclosure, since the light emergent surface of the color filter sheet is formed to be convex, the phenomenon of total reflection may be overcome so as to allow that all of the light reaching the entire light emergent surface from the quantum dot can be emitted from the surface, and therefore the light extraction efficiency is greatly improved. Furthermore, since the light incident surface is formed to be convex, the light radiated on the entire light incident surface can be used by the quantum dot, or the light receiving area is increased in other words, and the overall light absorption property of the quantum dot light-emitting portion is improved.

Further, in some embodiments, the color filter sheet according to this disclosure may correspond to a color filter sheet obtained by integrating a planar light-emitting portion and a microlens layer. In this case, by forming the light incident surface or the light emergent surface of the quantum dot light-emitting portion to be a convex surface, the thickness of the layer is somewhat increased and therefore the absorption of excitation light (i.e., the utilization rate of excitation light) and the light emission efficiency are also improved, compared to a planar light-emitting portion.

The absorbance of excitation light may be calculated according to equation (1) below:

$$A(\lambda)=\alpha(\lambda)\rho L \quad (1)$$

wherein $A(\lambda)$ is the absorbance of excitation light having a wavelength of $\lambda$;

$\alpha(\lambda)$ is the attenuation coefficient of a quantum dot to excitation light having a wavelength of $\lambda$;

$\rho$ is the density of a quantum dot; and

L is the optical path, which is directly proportional to the thickness of a quantum dot color filter layer.

The light emission efficiency of a quantum dot may be calculated according to equation (2) below:

$$E=A(\lambda)QL \quad (2)$$

wherein

E is the light emission efficiency of a quantum dot, $A(\lambda)$ is the absorbance of excitation light, Q is the photoluminescence quantum yield (PL-QY) of a quantum dot, and L is the optical path.

The quantum dot color filter layer may comprise a quantum dot, a dispersion medium (for example, resin), and a scattering additive (comprising a plurality of scattering particles). Blue light may be subjected to in-film waveguide propagation with a scattering additive so as to further increase the utilization rate of blue light. For example, some parts, which will not be irradiated with light, may be allowed to transmit blue light and emit light by waveguide. Furthermore, when the quantum dot receives excitation with blue light, photoluminescence will be formed. Therefore, the quantum dot in the color filter corresponds to emission using a plurality of point light sources.

A first quantum dot light-emitting portion and/or a second quantum dot light-emitting portion comprising a light incident surface or a light emergent surface which is a convex surface is present on a base substrate of the color filter sheet in an embodiment of this disclosure.

When the light incident surface of the quantum dot light-emitting portion is a convex surface, the light radiated on the entire light incident surface can be used by the quantum dot in the layer so as to increase the light receiving area. Furthermore, as the light incident surface is convex, L increases. Therefore, according to equation (2) described above, both $A(\lambda)$ and L increase, and therefore the light emission efficiency may be improved. Furthermore, according to equation (1) described above, the absorbance of incident light such as blue light may be improved so as to further improve the light emission efficiency.

When the light emergent surface of the quantum dot light-emitting portion is a convex surface, the light emitted from the quantum dot may be emitted from the entire surface so as to increase the light extraction efficiency. Furthermore, as the light emergent surface is convex, L increases. According to equation (1) described above, the absorbance of incident light such as blue light may be improved so as to further improve the efficiency.

Furthermore, a Bragg reflection layer may be further provided on the base substrate. Light (i.e., excitation light, such as blue light) emitted from a light source may pass through the Bragg reflection layer before reaching the quantum dot color filter layer. The Bragg reflection layer is transparent for excitation light. However, the Bragg reflection layer is reflective for the light emitted from the quantum dot. For example, when light emitted from a back side light source is used as a blue excitation light source, the light emitted from the light source first passes through a red or green Bragg reflection layer and then reaches a red or green quantum dot light-emitting portion. Red or green light emitted from the quantum dot light-emitting portion toward the light incident surface (i.e., to the back side) irradiates the distributed reflector and is reflected to the light emergent surface, and is emitted from the quantum dot light-emitting portion. Thus, the light emitted from the quantum dot to the back side is further utilized, and the light extraction efficiency is improved.

Optionally, the color filter sheet at least comprises a first Bragg reflection layer for transmitting light having a first wavelength and reflecting light having a second wavelength located between the base substrate and the first quantum dot light-emitting portion, and may further comprise a second Bragg reflection layer for transmitting light having a first wavelength and reflecting light having a third wavelength located between the base substrate and the second quantum dot light-emitting portion. For example, one Bragg reflection layer may be formed on the base substrate (the projection of the Bragg reflection layer on the substrate may at least cover the projection of the first quantum dot light-emitting portion and the second quantum dot light-emitting portion on the base substrate; and optionally, the projection of the Bragg reflection layer on the substrate may at least cover the projection of the first quantum dot light-emitting portion, the second quantum dot light-emitting portion, and the third transparent portion on the base substrate).

Figure 2:
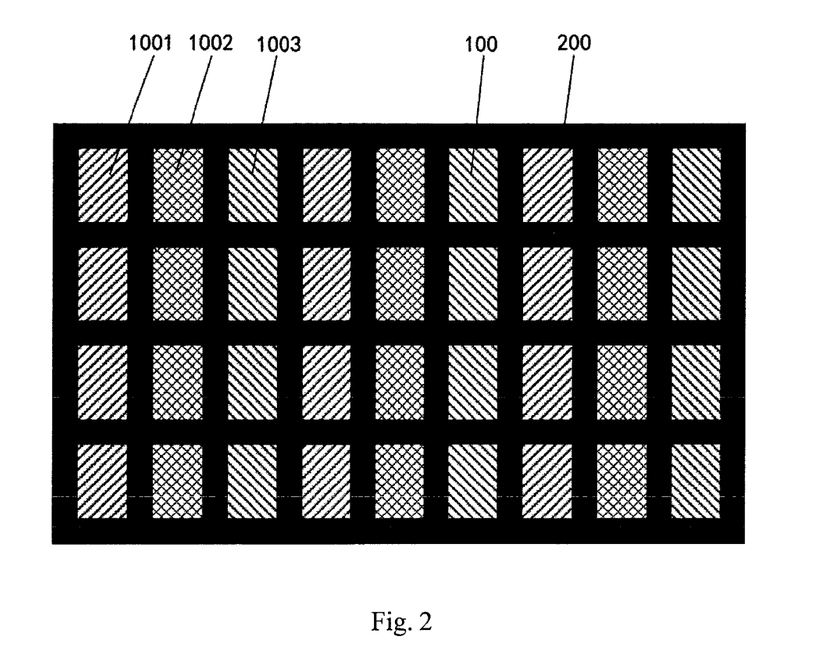
FIG. 2 is a schematic planar view exemplarily illustrating a color filter sheet according to one embodiment of this disclosure.

FIG. 2 is a schematic planar view exemplarily illustrating a color filter sheet according to one embodiment of this disclosure.

Figure 3A:
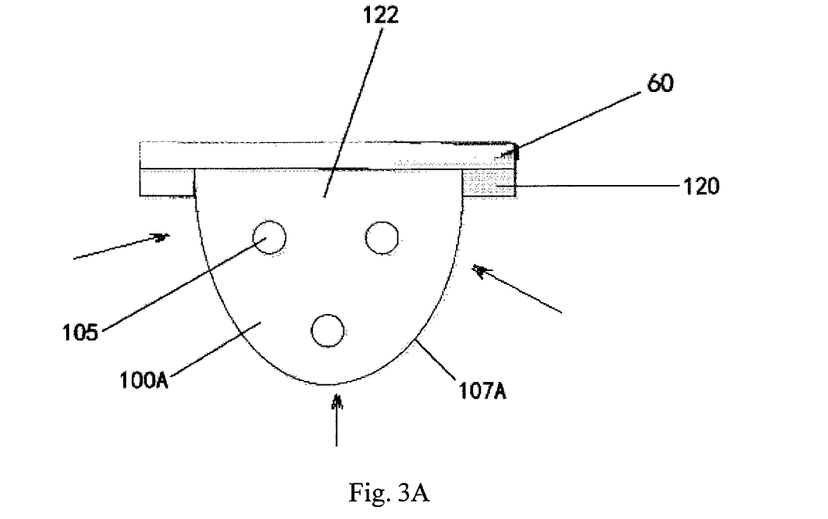
FIG. 3A is a schematic diagram exemplarily illustrating a color filter substrate according to one embodiment of this disclosure.
Figure 3B:
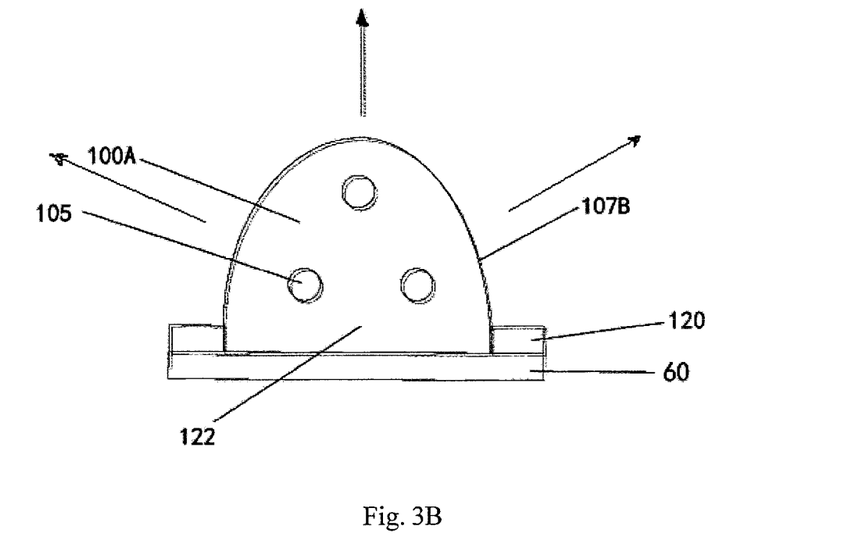
FIG. 3B is a schematic diagram exemplarily illustrating another color filter substrate according to one embodiment of this disclosure.

As shown in FIGS. 2, 3A, and 3B, the color filter sheet 100 comprises a base substrate 60, and the base substrate 60 has a red quantum dot light-emitting portion 1001, a green quantum dot light-emitting portion 1002, and a transparent portion 1003 thereon. In the red quantum dot light-emitting portion 1001, a first quantum dot may be excited to emit red light. In the green quantum dot light-emitting portion 1002, a second quantum dot may be excited to emit green light.

Particularly, the quantum dot light-emitting portion is located in an opening of a pixel defining layer 200 formed on the base substrate 60.

The base substrate 60 here may be a glass substrate or a polyethylene terephthalate (PET) substrate.

FIG. 3A is a schematic diagram exemplarily illustrating a color filter sheet according to one embodiment of this disclosure.

As shown in FIG. 3A, the color filter sheet may comprise a base substrate 60, a pixel defining layer 120 having an opening 122 on the base substrate 60, and a quantum dot light-emitting portion 100A having a quantum dot 105 formed in the opening 122 of the pixel defining layer 120. A light incident surface 107A of the quantum dot light-emitting portion 100A is a convex surface. The arrow indicates that the incident position of the light is throughout the light incident surface. The light radiated on the entire region of 107A may be utilized by the quantum dot 105 therein, and the light receiving area is increased so as to improve the overall efficiency. Furthermore, compared to a quantum dot light-emitting portion in the related art having the same thickness as that of the pixel defining layer 120, the thickness of the quantum dot light-emitting portion 100A is larger, and therefore the efficiency may be further improved according to equation (1).

FIG. 3B is a schematic diagram exemplarily illustrating another color filter sheet according to one embodiment of this disclosure.

As shown in FIG. 3B, the color filter sheet may comprise a base substrate 60, a pixel defining layer 120 having an opening 122 on the base substrate 60, and a quantum dot light-emitting portion 100A having a quantum dot 105 formed in the opening 122 of the pixel defining layer 120. A light emergent surface 107B of the quantum dot light-emitting portion 100A is a convex surface. The arrow indicates that the emergent position of the light is throughout the light emergent surface. In this case, the light emitted from the quantum dot 105 therein may be emitted from the entire region of 107B so as to increase the light receiving area. Furthermore, compared to a conventional quantum dot light-emitting portion having the same thickness as that of the pixel defining layer 120, the thickness of the quantum dot light-emitting portion 100A is larger, and therefore the overall light emission efficiency may be improved according to equation (2). Furthermore, L increases according to equation (1), and therefore the absorbance of blue light may be further improved so as to improve the efficiency.

Figure 4A:
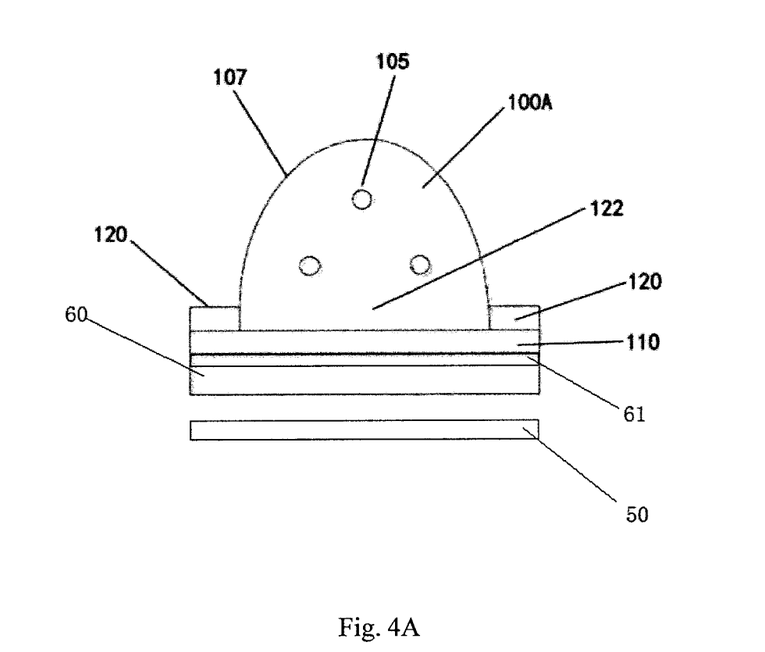
FIG. 4A is a schematic diagram exemplarily illustrating the structure of a color filter substrate according to one embodiment of this disclosure.

FIG. 4A is a schematic diagram exemplarily illustrating the structure of a color filter sheet according to one embodiment of this disclosure.

As shown in FIG. 4A, this color filter sheet is a TFT array color filter substrate (color filter on array). That is, structures such as a thin-film transistor array and the like are formed on a base substrate of a color filter sheet. A pixel defining layer is formed on the thin-film transistor array, and a quantum dot light-emitting portion is formed. In a display apparatus, a light source 50 corresponding to the color filter sheet may be comprised. For example, this light source 50 may emit blue light. The array color filter substrate may comprise a base substrate 60, a DBR reflector 110 (i.e., a Bragg reflection layer) on a thin-film transistor array 61 of the base substrate 60, a pixel defining layer 120 having an opening 122 formed on the DBR reflector 110, and a quantum dot light-emitting portion 100A having a quantum dot 105 formed in the opening 122 of the pixel defining layer 120. The upper surface 107 of the quantum dot light-emitting portion 100A is a convex surface. The blue light emitted from the light source 50 in the display apparatus passes through the DBR reflector 110 and reaches the quantum dot light-emitting portion 100A to generate red light or green light. The red light and the green light generated by the quantum dot light-emitting portion 100A cannot be transmitted to pass through the DBR reflector 110 and are reflected by the DBR reflector 110 toward the light emergent surface of the display apparatus.

It is to be noted that the illustrations of the base substrate, the thin-film transistor array, and the like in FIG. 4A are merely exemplary and do not represent structures and shapes in terms of physical entities.

Figure 4B:
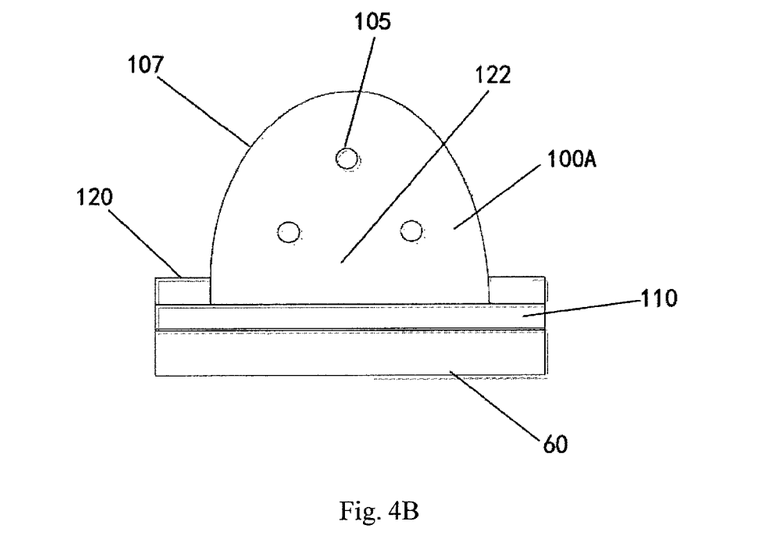
FIG. 4B is a schematic diagram exemplarily illustrating the structure of a color filter substrate according to one embodiment of this disclosure.

FIG. 4B is a schematic diagram exemplarily illustrating the structure of a color filter sheet according to one embodiment of this disclosure.

As shown in FIG. 4B, the color filter sheet may be a typical color filter substrate and is cell-aligned with an array substrate in a display module. A light source of a display apparatus is located on a side of the array substrate away from the color filter substrate, and the light emitted from the light source passes through the array substrate and irradiates the color filter substrate. The color filter sheet may comprise a base substrate 60, a DBR reflector 110 (i.e., a Bragg reflection layer) on the base substrate 60, a pixel defining layer 120 having an opening 122 formed on the DBR reflector 110, and a quantum dot light-emitting portion having a quantum dot 105 formed in the opening 122 of the pixel defining layer 120. The upper surface 107 of the quantum dot light-emitting portion 100A is a convex surface. Blue light emitted from a blue light source in the display apparatus passes through the DBR reflector 110 and reaches the quantum dot light-emitting portion 100A to generate red light or green light. The red light and the green light generated by the quantum dot light-emitting portion 100A cannot pass through the DBR reflector 110 and are reflected by the DBR reflector 110.

Although the implementation of the color filter sheet in a liquid crystal display module has been described as shown above (the deflection angle of liquid crystal molecules is controlled by controlling the voltage applied to the liquid crystal so as to control the amount of the light which is emitted from the light source and reaches the quantum dot light-emitting portion), this disclosure is not limited thereto. For example, a lens layer corresponding to the quantum dot light-emitting portion and the transparent portion may be provided between the light source and the color filter sheet. The amount of the light reaching the quantum dot light-emitting portion and the like is controlled by controlling Refraction and focusing of the light emitted from the light source. In FIGS. 2, 3A, 3B, 4A, and 4B, the quantum dot light-emitting portion is located in the opening 122 of the pixel defining layer, the convex surface of the quantum dot light-emitting portion has a radius of curvature in a range of 1 to 5 times the length of the opening 122. The convex surface of the quantum dot light-emitting portion is a convex surface in which the center is high and the periphery is low. The ratio of the distance from the vertex of the convex surface of the quantum dot light-emitting portion to the bottom of the quantum dot light-emitting portion to the distance from the periphery of the convex surface of the quantum dot light-emitting portion to the bottom of the quantum dot light-emitting portion is 5 or less, or 4 or less, or 3 or less, or 2 or less. The ratio of the distance from the vertex of the convex surface of the quantum dot light-emitting portion to the bottom of the quantum dot light-emitting portion to the distance from the periphery of the convex surface of the quantum dot light-emitting portion to the bottom of the quantum dot light-emitting portion is greater than 1, or greater than or equal to 1.1, or greater than or equal to 1.2, or greater than or equal to 1.5.

In an Example of this disclosure, The Bragg reflection layer may comprise a film layer structure formed from ZnS having 0.22-0.27 WV (Wavelength Vector) and/or NaAlF having 0.21-0.28 WV. For example, the Bragg reflection layer is formed from ZnS having 0.25 WV and/or NaAlF having 0.25 WV by evaporation, sputtering, and the like.

In an Example of this disclosure, an LED light source array may be used as a light source, which comprises a plurality of LED light sources corresponding to quantum dot light-emitting portions so as to emit light beams to the color filter sheet to excite quantum dots; a side light source may also be used, wherein the direction of the light path is changed by a light guide plate so as to emit light beams to the color filter sheet to excite quantum dots; and a light path adjusting layer may also be provided between the light source and the color filter sheet (for example, a lens may be provided) so as to form parallel light emitted to the color filter sheet from the light emitted from the light source.

Figure 5:
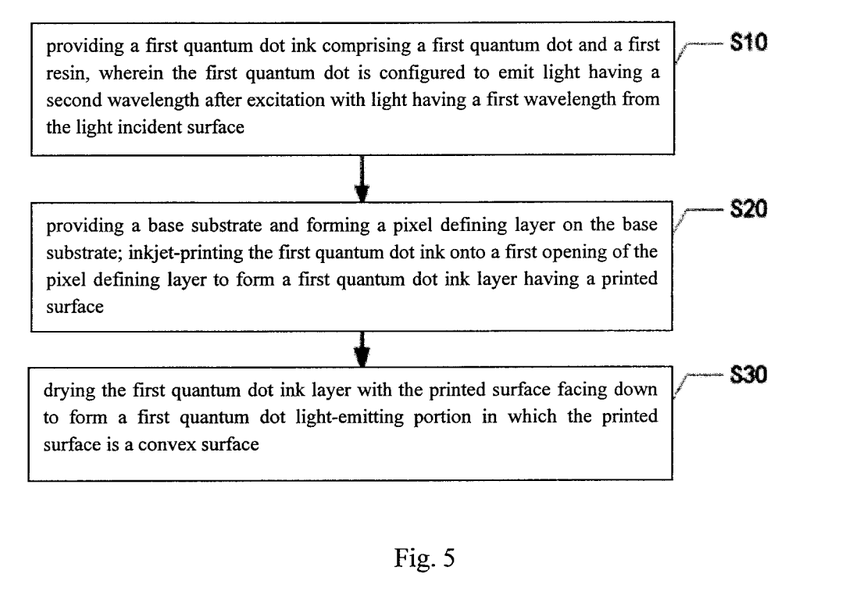
FIG. 5 is a process flow chart exemplarily illustrating the production of a color filter sheet according to one embodiment of this disclosure.

FIG. 5 is a process flow chart exemplarily illustrating the production of a color filter sheet according to one embodiment of this disclosure.

As shown in FIG. 5, the method of producing a color filter sheet may comprise the following steps:

S10: providing a first quantum dot ink comprising a first quantum dot and a first resin, wherein the first quantum dot is configured to emit light having a second wavelength after excitation with light having a first wavelength from the light incident surface;

S20: providing a base substrate and forming a pixel defining layer on the base substrate; inkjet-printing the first quantum dot ink onto a first opening of the pixel defining layer to form a first quantum dot ink layer having a printed surface; and S30: drying the first quantum dot ink layer with the printed surface facing down to form a first quantum dot light-emitting portion in which the printed surface is a convex surface.

Optionally, the method of producing a color filter sheet may further comprise the following steps:

S40: providing a second quantum dot ink comprising a second quantum dot and a second resin after the first quantum dot light-emitting portion is formed, wherein the second quantum dot is configured to emit light having a third wavelength after excitation with light having a first wavelength from the light incident surface, wherein the third wavelength is different from the second wavelength; and S50: inkjet-printing the second quantum dot ink onto a second opening of the pixel defining layer to form a second quantum dot ink layer having a printed surface; and S60: spin-drying the second quantum dot ink layer with the printed surface of the second quantum dot ink facing down to form a second quantum dot light-emitting portion in which the printed surface is a convex surface.

The method of producing a color filter sheet may further comprise the following step:

S70: forming a third transparent portion for transmitting light having a first wavelength in a third opening of the pixel defining layer before or after the first quantum dot light-emitting portion and/or second quantum dot light-emitting portion are formed.

Additionally, as needed, the inkjet printing of the first quantum dot ink and the second quantum dot ink may also be performed simultaneously, followed by drying. This may allow the method to be simpler.

Furthermore, the third transparent portion may also be formed from a third ink by an inkjet printing process. Therefore, as needed, the inkjet printing of the first quantum dot ink, the second quantum dot ink, and the third ink may also be performed simultaneously, followed by drying. This may allow the method to be simpler.

In some Examples, drying is performed by spinning the color filter sheet, wherein the spin speed may be 10 rpm to 1000 rpm, the drying temperature may be 20° C. to 160° C., and the drying time may be 1 minute to 60 minutes.

In an Example of this disclosure, by drying the quantum dot ink layer with the printed surface of the quantum dot ink facing down, peristalsis is generated by gravity to form a specific curvature.

Herein, "facing down" refers to a direction substantially toward the surface of the earth. The magnitude of the radius of curvature is related to the opening area/volume, the viscosity and the surface tension of the quantum dot ink, and the like. Desired curvatures are formed by using this method, with respect to the red quantum dot light-emitting portion and the green quantum dot light-emitting portion.

For example, the first quantum dot ink may have a viscosity of 5-20 cPs and a surface tension of 20-40 dynes.

For example, the second light-emitting quantum dot ink may have a viscosity of 5-20 cPs and a surface tension of 20-40 dynes.

As described above, the resin in the first quantum dot ink and the second light-emitting quantum dot ink may include polymethyl methacrylate resin, silicone resin, acrylic resin, and the like.

Optionally, the quantum dot ink may further comprise a solvent, such as an organic solvent. The organic solvent may be propylene glycol methyl ether acetate (PGMEA).

For example, in some examples, the percent by mass of the quantum dots in the quantum dot ink may be 5%-10%, the percent by mass of the resin in the quantum dot ink may be 5%-25%. Therefore, on the one hand, phenomena such as agglomeration of quantum dots may be prevented, and on the other hand, a relatively high conversion efficiency of blue light may be obtained. Additionally, this quantum dot ink may be adapted to the inkjet printing process.

For example, in some examples, the percent by mass of the quantum dots in the quantum dot ink may be 5%, the percent by mass of the resin in the quantum dot ink may be 10%. Therefore, on the one hand, phenomena such as agglomeration of quantum dots may be prevented, and on the other hand, a relatively high conversion efficiency of blue light may be obtained. Additionally, this quantum dot ink may be adapted to the inkjet printing process.

The thickness of the film layer may be adjusted by adjusting the number of printing, the drop number of printing, and the size liquid droplet, and the curvature of the surface of the quantum dot light-emitting portion may be adjusted by adjusting the viscosity and the surface tension of the quantum dot ink.

In one embodiment of this disclosure, with respect to the light extraction efficiency, light receiving measurement with an opening angle of 170 degrees is performed by using an integrating sphere. With respect to the absorbance, transmission and absorption measurement of various wavelengths is performed by using UV-Visible (a commercial instrument).

In another aspect, this disclosure may further provide a display panel, comprising the color filter sheet of any one described above. Therefore, it is possible to improve the absorbance of excitation light and/or further improve the light extraction efficiency.

For example, this display panel further comprises an array substrate, which is cell-aligned with the color filter sheet; and a liquid crystal layer provided between the array substrate and the color filter substrate.

In another aspect, this disclosure may further provide a display apparatus, comprising the color filter sheet of any one described above and a light source, wherein the light source has a light emergent side (a direction in which the light emitted from the light source is finally ejected) facing the base substrate of the color filter sheet. Therefore, it is possible to improve the absorbance of excitation light and/or further improve the light extraction efficiency.

For example, the display apparatus may be any electronic product having a function of display, such as a cell phone, a computer, a television, a notebook computer, a navigator, a wearable display apparatus, and the like.

It is to be indicated that the display apparatus may be a liquid crystal display apparatus or may be an organic light-emitting diode display apparatus. This is not limited in this disclosure.

According to this disclosure, there may be provided a color filter sheet, a production method of a color filter sheet, and a display apparatus. The color filter sheet comprises a first quantum dot light-emitting portion, in which a light incident surface or a light emergent surface is a convex surface, on a base substrate. When the incident surface of the first quantum dot light-emitting portion is a convex surface, the absorbance of light having a first wavelength may be improved. For example, the absorbance of light having a first wavelength may be improved by 10% or more so as to improve the efficiency, and the light receiving area may be improved. When the emergent surface of the first quantum dot light-emitting portion is a convex surface, the absorbance of light having a first wavelength may be improved. For example, the absorbance of light having a first wavelength may be improved by 10% or more so as to improve the efficiency, and the light extraction efficiency may be improved. For example, the light extraction efficiency may be improved by 25% or more.

In the case where the color filter sheet further comprises a second quantum dot light-emitting portion, in which a light incident surface or a light emergent surface is a convex surface, on the base substrate, When the incident surface of the second quantum dot light-emitting portion is a convex surface, the absorbance of light having a second wavelength may be improved. For example, the absorbance of light having a second wavelength may be improved by 10% or more so as to improve the efficiency, and the light receiving area may be improved. When the emergent surface of the second quantum dot light-emitting portion is a convex surface, the absorbance of light having a second wavelength may be improved. For example, the absorbance of light having a second wavelength may be improved by 10% or more so as to improve the efficiency, and the light extraction efficiency may be improved. For example, the light extraction efficiency may be improved by 25% or more.

Obviously, various modifications and variations may be made to the Examples of this disclosure by the person skilled in the art without deviating from the spirit and the scope of this disclosure. Thus, if these modifications and variations of this disclosure are within the scope of the claims of this disclosure and equivalent techniques thereof, this disclosure also intends to encompass these modifications and variations.

What is claimed is:

1. A color filter sheet, comprising:
    a base substrate;
    a first quantum dot light-emitting portion located on the base substrate, wherein the first quantum dot light-emitting portion has a light incident surface departing from the base substrate and a light emergent surface facing the base substrate, the first quantum dot light-emitting portion is configured to emit light having a second wavelength after excitation with light having a first wavelength from the light incident surface,
    wherein the light incident surface of the first quantum dot light-emitting portion is a convex surface and does not comprise a plane,
    wherein the color filter sheet further comprises a Bragg reflection layer, wherein the Bragg reflection layer is located at a side of the first quantum dot light-emitting portion departing from the base substrate, and is configured to at least transmit a part of light having a first wavelength emitted from a light source and at least partially reflect light having a second wavelength emitted from the first quantum dot light-emitting portion toward the Bragg reflection layer.

2. The color filter sheet according to claim 1, further comprising:
    a second quantum dot light-emitting portion located on the base substrate, wherein the second quantum dot light-emitting portion has a light incident surface departing from the base substrate and a light emergent surface facing the base substrate, the second quantum dot light-emitting portion is configured to emit light having a third wavelength after excitation with light having a first wavelength from the light incident surface, wherein the third wavelength is different from the second wavelength, wherein the light incident surface of the second quantum dot light-emitting portion is a convex surface.

3. The color filter sheet according to claim 1, further comprising:
a transparent portion for transmitting light having a first wavelength located on the base substrate.

4. The color filter sheet according to claim 2, wherein the light having the first wavelength is blue light, and one of the light having the second wavelength and the light having the third wavelength is red light and the other one is green light.

5. The color filter sheet according to claim 1, wherein a pixel defining layer is present on the base substrate, the first quantum dot light-emitting portion is located in a first opening of the pixel defining layer, the convex surface of the first quantum dot light-emitting portion has a radius of curvature in a range of 1 to 5 times the length of the first opening.

6. The color filter sheet according to claim 2, wherein the second quantum dot light-emitting portion is located in a second opening of the pixel defining layer, the convex surface of the second quantum dot light-emitting portion has a radius of curvature in a range of 1 to 5 times the length of the second opening.

7. The color filter substrate according to claim 2, further comprising a Bragg reflection layer, wherein the Bragg reflection layer is located at a side of the second quantum dot light-emitting portion departing from the base substrate, and is configured to at least transmit a part of light having a first wavelength emitted from a light source; and/or configured to at least partially reflect light having a third wavelength emitted from the second quantum dot light-emitting portion toward the Bragg reflection layer.

8. A display apparatus, comprising a light source and the color filter sheet according to claim 1, wherein the light source has a light emergent side facing the base substrate of the color filter sheet, and the light source is configured to emit light having the first wavelength.

9. The color filter sheet according to claim 1, wherein a ratio of a distance from a vertex of the light incident surface of the first quantum dot light-emitting portion to a bottom of the first quantum dot light-emitting portion to a distance from a boundary of the light incident surface of the first quantum dot light-emitting portion to the bottom of the first quantum dot light-emitting portion is between 1 and 5.

10. The color filter sheet according to claim 2, wherein a ratio of a distance from a vertex of the light incident surface of the second quantum dot light-emitting portion to a bottom of the second quantum dot light-emitting portion to a distance from a boundary of the light incident surface of the second quantum dot light-emitting portion to the bottom of the second quantum dot light-emitting portion is between 1 and 5.

11. A color filter sheet, comprising:
a base substrate;
a first quantum dot light-emitting portion located on the base substrate, wherein the first quantum dot light-emitting portion has a light incident surface departing from the base substrate and a light emergent surface facing the base substrate, the first quantum dot light-emitting portion is configured to emit light having a second wavelength after excitation with light having a first wavelength from the light incident surface,
wherein the light incident surface of the first quantum dot light-emitting portion is a convex surface and does not comprise a plane,
wherein the color filter sheet further comprises a Bragg reflection layer, wherein the Bragg reflection layer is located at a side of the first quantum dot light-emitting portion departing from the base substrate, and is configured to at least transmit a part of light having a first wavelength emitted from a light source and at least partially reflect light having a second wavelength emitted from the first quantum dot light-emitting portion toward the Bragg reflection layer,
wherein a projection of the Bragg reflection layer on the base substrate completely covers a projection of the first quantum dot light-emitting portion on the base substrate.

* * * * *